United States Patent
Hwang et al.

(10) Patent No.: US 8,940,618 B2
(45) Date of Patent: Jan. 27, 2015

(54) METHOD AND DEVICE FOR CUTTING SEMICONDUCTOR WAFERS

(75) Inventors: Chien Ling Hwang, Hsinchu (TW); Lin-Wei Wang, Zhubei (TW); Chung-Shi Liu, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/419,023

(22) Filed: Mar. 13, 2012

(65) Prior Publication Data
US 2013/0244403 A1 Sep. 19, 2013

(51) Int. Cl.
*H01L 21/00* (2006.01)

(52) U.S. Cl.
USPC .......................... 438/462; 438/460

(58) Field of Classification Search
CPC ........................................................ H01L 21/78
USPC .................................. 438/106–127, 460–465
See application file for complete search history.

(56) References Cited

U.S. PATENT DOCUMENTS

| | | | |
|---|---|---|---|
| 3,497,948 A * | 3/1970 | Wiesler et al. ............... | 438/464 |
| 4,033,027 A * | 7/1977 | Fair et al. ..................... | 438/465 |
| 6,114,191 A * | 9/2000 | Young et al. .................. | 438/125 |
| 6,478,918 B2 * | 11/2002 | Bennett et al. ................ | 156/248 |
| 6,649,445 B1 * | 11/2003 | Qi et al. ........................ | 438/108 |
| 6,649,448 B2 * | 11/2003 | Tomihara ...................... | 438/113 |
| 6,806,035 B1 * | 10/2004 | Atireklapvarodom et al. ......................... | 430/313 |
| 6,869,861 B1 * | 3/2005 | Glenn et al. .................. | 438/462 |
| 6,902,955 B2 * | 6/2005 | Tomihara ...................... | 438/113 |
| 6,933,211 B2 * | 8/2005 | Kurosawa ..................... | 438/460 |
| 7,556,985 B2 * | 7/2009 | Fukasawa et al. ............ | 438/113 |
| 7,566,634 B2 * | 7/2009 | Beyne et al. .................. | 438/462 |
| 7,776,720 B2 * | 8/2010 | Boyle et al. .................. | 438/463 |
| 7,813,135 B2 * | 10/2010 | Mori et al. .................... | 361/719 |
| 7,858,499 B2 * | 12/2010 | Plaut et al. ................... | 438/464 |
| 7,906,847 B2 * | 3/2011 | Ohtani et al. ................. | 257/729 |
| 7,960,814 B2 * | 6/2011 | Vo ................................ | 257/620 |
| 2004/0130004 A1 * | 7/2004 | Kurosawa ..................... | 257/628 |
| 2005/0181316 A1 * | 8/2005 | Frodis et al. ................. | 430/455 |
| 2006/0084239 A1 * | 4/2006 | Nagai et al. .................. | 438/460 |
| 2008/0012096 A1 * | 1/2008 | Sin et al. ...................... | 257/620 |
| 2008/0150087 A1 * | 6/2008 | Farooq et al. ................ | 257/620 |
| 2009/0098712 A1 * | 4/2009 | Taguchi et al. ............... | 438/462 |
| 2009/0152683 A1 * | 6/2009 | Nguyen et al. ............... | 257/620 |
| 2009/0298262 A1 * | 12/2009 | Horsfield ...................... | 438/460 |
| 2011/0029124 A1 * | 2/2011 | Boyle et al. .................. | 700/121 |
| 2011/0227201 A1 * | 9/2011 | Too et al. ..................... | 257/618 |
| 2012/0264238 A1 * | 10/2012 | Boyle et al. .................. | 438/14 |

OTHER PUBLICATIONS

Quality Matters Newsletter—Diamond Wafer Cutting, by Zipperian, PACE technologies, Oct. 2002.*

* cited by examiner

*Primary Examiner* — Charles Garber
*Assistant Examiner* — Evren Seven
(74) *Attorney, Agent, or Firm* — Lowe Hauptman & Ham, LLP

(57) ABSTRACT

A method for cutting a semiconductor wafer into semiconductor chips that reduces defects at the semiconductor chip corners. The method includes a pre-cutting processing step of trimming the semiconductor chip corners so that mechanical stress is reduced at the corners. The method includes dicing channels on a semiconductor wafer thereby defining the geometrical shape of one of the semiconductor chips, modifying the corners of the one of the semiconductor chips, and cutting the semiconductor wafer to separate the one of the semiconductor chips from other semiconductor chips.

20 Claims, 5 Drawing Sheets

US 8,940,618 B2

METHOD AND DEVICE FOR CUTTING SEMICONDUCTOR WAFERS

TECHNICAL FIELD

This disclosure relates generally to semiconductor devices, and more particularly to a semiconductor chip shape modification and the apparatus for making such modification.

BACKGROUND

Semiconductor wafers are generally produced in relatively large dimension in the form of large diameter disks. The semiconductor wafers are subsequently diced and cut into semiconductor chips of much smaller size for use in the production of integrated circuits. The geometric shape of the peripheral area of a semiconductor chip has a profound impact on the physical integrity of the chip. Traditionally, semiconductor chips were formed by cutting a processed wafer into predetermined pieces using a straight cutting device, such as a mechanical saw or a laser-cutting device. These mechanical straight-cutting tools create semiconductor chips that have square or rectangular shapes. Because of the ninety-degree corners in the square and rectangular shapes, there is always a tremendous amount of stress occurring at the corners of these square and rectangular shaped semiconductor chips. This additional mechanical stress causes physical defects, such as chipping and/or cracking at the edges of the semiconductor chips. Such physical defects often occur during the subsequent packaging process steps when the chips undergo additional stress.

FIG. 1 depicts a prior art semiconductor wafer 100 and chip 110. In this case, the semiconductor wafer 100 is cut using traditional straightedge mechanical saw 120 that follows a perpendicular dicing pattern 101. Once the semiconductor wafer 100 is cut using the mechanical saw 120, numerous chips (or dies) 110 are formed. As a result of using the mechanical saw 120 in a straight-line fashion, the resulting dies 110 have square or rectangular shapes.

FIG. 2 illustrates the problem associated with this prior art semiconductor chips 110 having a square or rectangular shape as a result of using this traditional cutting method. Specifically, as depicted in FIG. 2, there is tremendous amount of mechanical stress built-up at the ninety-degree corners 130 of the square and rectangular semiconductor chips 110. Such stress makes the semiconductor chip 110 prone to physical defects. For instance, when additional layers are being pressed onto the semiconductor chip 110 in a subsequent packaging process, the corners 130 of the semiconductor chip 110 may experience such as delamination or chipping.

When delamination occurs, for example, the physical defect would propagate inward, towards the active area of the semiconductor chip 110. Once the physical defect caused by delamination, such as a crack, reaches the active area, the semiconductor chip 110 would no longer be able to function properly and therefore fails. Some prior art semiconductor chips 110 include physical barriers to prevent propagation of cracks, such as introduction of a crack stop, these crack stops are largely ineffective as semiconductor technology advances and different materials are being used to make the chips. These measures attempt to fix the symptom rather than solving the root cause of the problem.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

The making and using of one or more embodiments in accordance with the present disclosure are discussed in detail below. It should be appreciated, however, that the present disclosure provides many applicable inventive concepts that can be embodied in a wide variety of specific contexts. The specific embodiments discussed are illustrative and do not limit the scope of the invention. Moreover, in the figures, various aspects of the structures and apparatuses have been depicted and schematically represented in a simplified manner to more clearly describe and illustrate the disclosure.

By way of overview and introduction, the present disclosure is directed to a method for creating a semiconductor chip without straightedge corners, i.e., corners that are not ninety-degree angles.

Figure 1:
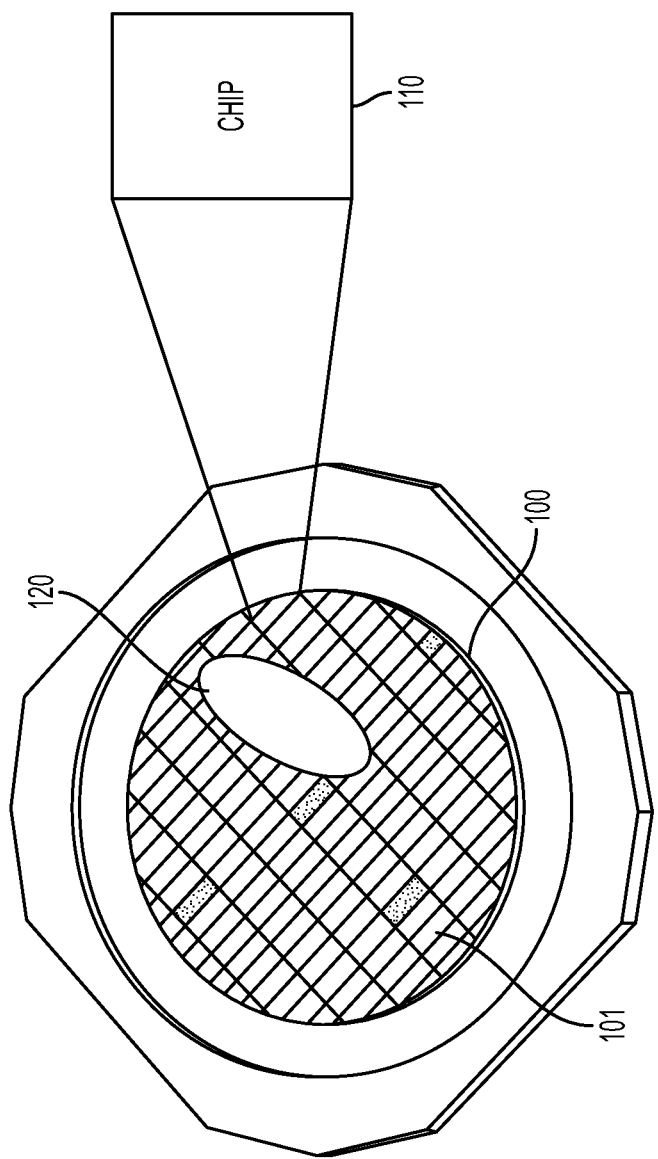
FIGS. 1 and 2 are a perspective view of a prior art wafer and a mechanical saw and a top view of a prior art chip that illustrate the problems associated with the prior art semiconductor chip cutting method.

FIG. 1 is an illustrative perspective view showing a processed semiconductor wafer 100 before the wafer 100 has been diced into smaller, individual semiconductor chips. The semiconductor wafer 100 is typically aligned on a vacuum chuck or other holding device with reference to one or more distinct regions provided on the circumference that has a flat surface. A resin layer is placed underneath the processed semiconductor wafer 100. In this embodiment, on the semiconductor wafer 100, cut grooves 101 are formed in two directions perpendicular to each other, and the cut groves 101 parallel to one another are equidistantly positioned. The cut groves are in positions along the scribe lines.

Figure 2:
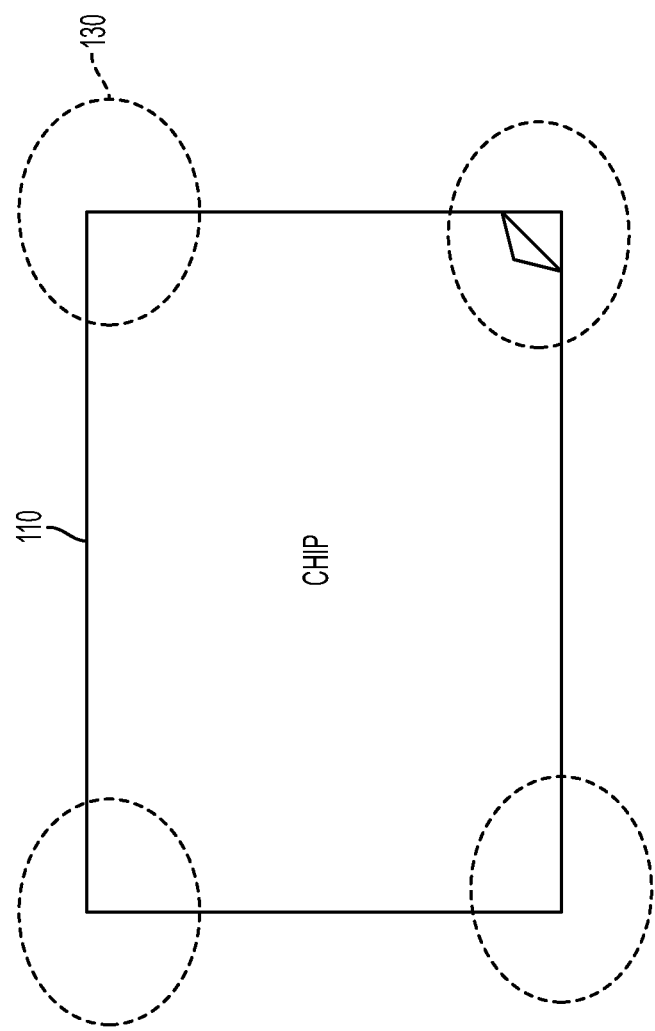

As FIG. 2 shows, in the first step, a first protection layer, which is a tape having a first adhesion layer, is provided. Then, in the next step, after a semiconductor wafer 100 has been manufactured, the semiconductor wafer 100, on which a plurality of semiconductor chips is formed, is provided. The semiconductor wafer 100 has a top surface and a bottom surface, and the bottom surface of the wafer 100 is placed on the first protection layer and is adhere to the first protection layer by the adhesive layer.

In this embodiment, plurality of predefined vertical and cut grooves (or "saw streets") 101 are formed on the semiconductor wafer 100 to define the individual semiconductor chips and to indicate how the wafer 100 would be subsequently separated into separate semiconductor chips.

The semiconductor wafer 100 is adhesively bonded to a backing sheet prior to and during the dicing step. Once the wafer is pattern diced to produce a plurality of semiconductor chips, each chip must be removed from the backing sheet for further process. Generally speaking, adhesives such as acrylate adhesives are used to bond the semiconductor wafer to the backing sheet.

In generally a pressure sensitive adhesive tape, which is designed to exhibit the temporary bonding desirable for use in the semiconductor wafer dicing process, is used. The adhesion level can be tailored to provide sufficient bonding strength so that the wafer can be securely held in position during dicing and cleaning of the semiconductor chip. Typical adhesion levels of such tapes as characterized by 180 degree peel on stainless steel can range as low as, but not limited to 0.5 oz/in, and as high as, but not limited to, 90 oz/in. When the pressure sensitive tape of the present invention is subjected to an elevated temperature of at least 50 degree Celsius, the adhesive becomes detackified and loses its pressure sensitive adhesive properties. Upon heat treatment, the typical peel adhesion of the tape can be decreased sufficiently low to permit removal of the diced chip from the tape. The detackification of the adhesive is irreversible.

In the current disclosure, the pressure sensitive adhesive tape typically comprises a backing film, a pressure sensitive adhesive layer and a release liner to protect the adhesive coating. The backing film is typically a polymeric material, or a blend of polymeric materials. Such materials include but are not limited to polyethylene, polypropylene, polyvinyl chloride, polyvinylidene chloride, polyester, polyamide, polyurethane, polyether, polycarbonate, polysolfone, polyketone, polyetherketone, polyimide, copolymers of styrene-diene, copolymer of butylenes terephthalate-ether, and natural or synthetic rubbers. Alternative backing materials that can be used include foam, metal foil, and paper. In generally, expandable films which exhibit good heat resistance are preferred. The backing film generally has a thickness of from 0.1 to 5 millimeters, preferably from 0.5 to 1.0 millimeter.

The pressure sensitive adhesive layer of the pressure sensitive adhesive tape comprise a pressure sensitive adhesive, at least one multifunctional monomeric or oligomeric component, and/or at least one free radical initiator, and optionally, a crosslinking agent.

The pressure sensitive adhesive or adhesive blend may comprise, for example, tackified natural rubbers, synthetic rubbers, tackified styrene block copolymers, polyvinyl ethers, acrylic adhesives, poly-alpha-olefins and silicone adhesives, as well as blends thereof. In some embodiments, the acrylic adhesives are polymers or copolymers of acrylic acid, t-bytylmethacrylate, butyl acrylate, 2-ethyl-hexylacrylate, glycidyl methacrylate, hydroxyethylacrylate, N-methylol acrylamide, isobornyl methacrylate, N-vinylpyrrolidone or vinyl acetate.

The multifunctional vinyl monomeric or oligomeric component includes, but is not limited to, vinyl ethers, styrenic monomers, diene monomers, acrylates and methacrylates.

Before cutting the semiconductor wafer 100 into to smaller dies using the traditional methods such as mechanical saws or laser cutting device, however, an additional process step is performed.

Figure 3:
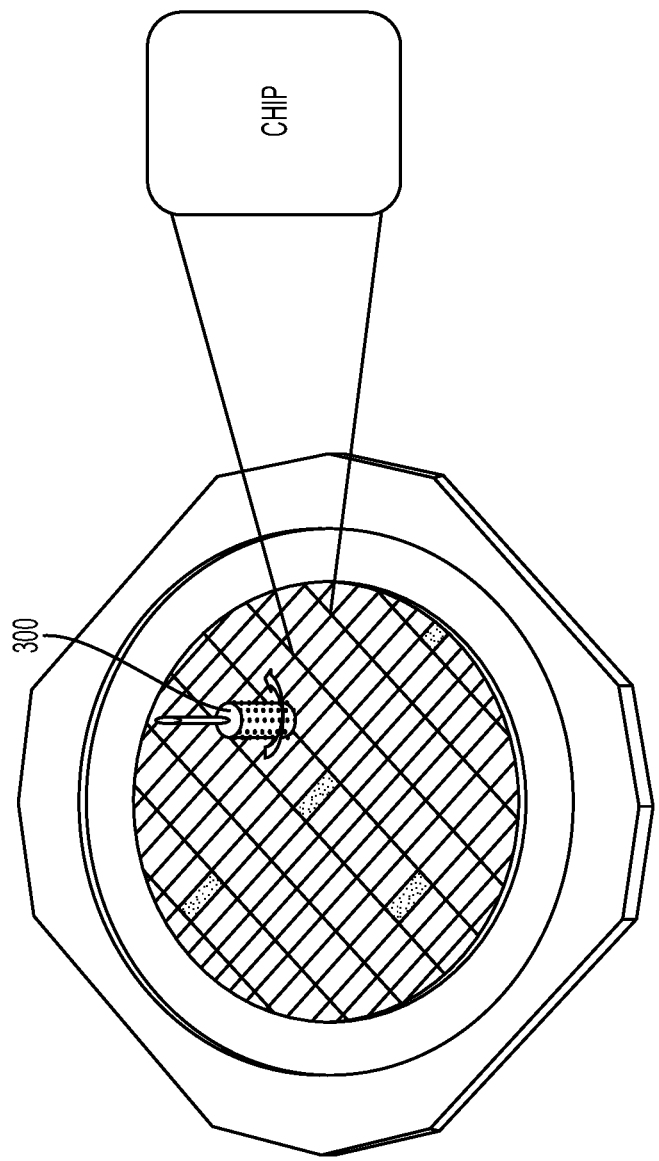
FIG. 3 is a perspective view of a wafer and a trimming device in accordance with one embodiment of the present disclosure.

In this embodiment, as FIG. 3 shows, before cutting the finished semiconductor wafer 100 into separate dies using mechanical saws, a separate trimming device is applied to the semiconductor wafer 100. In this embodiment, a trimming device comprises a cylindrically shaped trimming part 300. This cylindrical-shaped trimming part 300 acts as an abrasive drill. The trimming part 300 operates by rotating in a clockwise or a counter clock-wise direction. The axis of the rotation for the trimming part 300 is along the same direction as the length of the cylinder. The speed of the rotation, or the operating RPM, of the trimming part 300 can be varied.

An important aspect of the present disclosure is the location of the trimming part 300 when being applied to the semiconductor wafer 300. The primary purpose of applying the trimming device to the semiconductor wafer is to remove some chip material from the sharp, ninety-degree corners from the semiconductor chips. The goal is to change the sharp edge corners into round shaped edges. Therefore, the positioning of the trimming part 300 of the trimming device is controlled that, when the trimming part 300 rotates, the trimming part 300 removes the appropriate amount of the semiconductor material from the chip corners.

Figure 4:
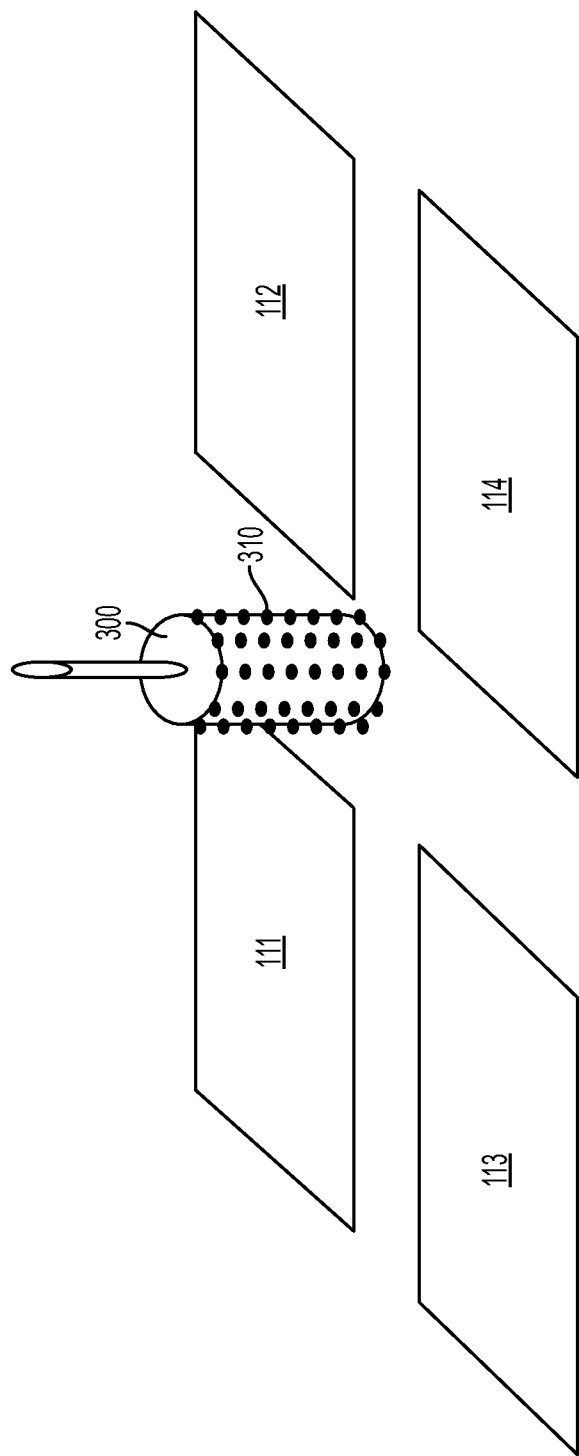
FIG. 4 is a close-up view of the wafer and the trimming device in accordance with one embodiment of the present disclosure.

In this embodiment, as FIG. 4 shows, the trimming part 300 is positioned at the center of the "intersection" of a horizontal and a vertical cutting groove. In this embodiment, when the trimming part 300 is lowered onto the semiconductor wafer 100, the trimming part 300 begins at a fixed position moves laterally during its operation.

The diameter of the trimming part 300 is set depending on the amount of the semiconductor chip corner one wants to remove. The diameter setting of the trimming part 300 is when, as in this embodiment, the trimming part 300 moves in a relatively small circular path. Therefore the diameter of the trimming part 300 in this embodiment is set to be large enough so that when the trimming part 300 rotates along its vertical axis, the trimming portion will be in contact with all four corners of the four semiconductor chips.

The physical elements of the trimming part 300 (i.e., the abrasive drill) will now be described. A component of the trimming part 300 of the trimming device is the grit 310 (FIG. 4) on the surface of the drill. The trimming part 300 is used as an abrasive. In this embodiment, the grit 310 can be formed of diamond or CBN (cubic boon nitride), or other suitable materials that is sufficiently hard and can be used as a cutting tool. In this embodiment, the grit sizes can vary from 2 to 8 um.

As FIG. 3 shows, in this embodiment, the angular shape of the grit is preferred than blocky shape for better cutting quality. In particular, the grit should be sharpened and the sharpened edge should be exposed.

Also, the size of the grit also affects both the life expectancy of the drill and cutting quality. With the bigger grit size, the drill can remove more silicon material with the same spindle speed. If the drilling surface contains larger size grit, the life expectancy of the drill is prolonged. However, large grit size would decrease the cutting quality. Therefore, the grit size selection needs to be balanced between cutting capability and manufacturing cost.

Also, the grit concentration affects the quality and life expectancy of the drill. In general, higher concentration of the grit can extend the life expectancy of the drill and reduce die top chipping. On the other hand, lower concentration of the grit can lower the life expectancy of the drill but increase die top chipping. Hard bonding material can hold the grit more tightly on the drill, thus increasing the drill life expectancy.

However, soft bonding material, while contribute to lower drill life expectancy, can accelerate the self-sharpening effect of the drill.

FIG. 4 is a close-up view of the wafer and the trimming device in accordance with one embodiment of the present disclosure. In this embodiment, an abrasive drill 300 is placed in the center of the intersection of a vertical and a horizontal cutting grove on a processed wafer 100. As such, the abrasive drill 300 is equidistant from the corners of four semiconductor dies 111, 112, 113, and 114.

In the current embodiment, the diameter of the trimming part 300 is pre-selected such that when the trimming part 300 rotates, the grit on the surface of the trimming part 300 come into contact with any of the corners of the four semiconductor dies 111, 112, 113, and 114. As a result, the four corners of the semiconductor chips 111, 112, 113, and 114 are being trimmed by the abrasive drill 300 at the same time. Note that in this embodiment, as discussed above, once the abrasive drill 300 is being placed into the pre-drilling position, the abrasive drill 300 is in a fixed position and does not move when the trimming commences.

As discussed before, the amount of semiconductor material to be trimmed is also determined by the duration of the trimming operation and the width of the trimming part diameter, both of which can be controlled and preset. Also, the vertical distance between the trimming part and the semiconductor wafer 100 can also be controlled. In this embodiment, the trimming part 300 is placed onto the semiconductor wafer 100, so that the base of the trimming part 300 touches the surface of the groove channel. As a result, the entire vertical portions of the semiconductor chip corners are in contact with the trimming part 300.

After the corners of the semiconductor chips 101, 102, 103, and 104 have been trimmed and achieved an intended rounded shape, a cutting device will then be used to dice the semiconductor wafer 100 into semiconductor chips. A cutting device, such as a mechanical saw or a laser cutting apparatus, is used to cut the semiconductor wafer into a plurality of individual semiconductor chips along the channels.

Figure 5:
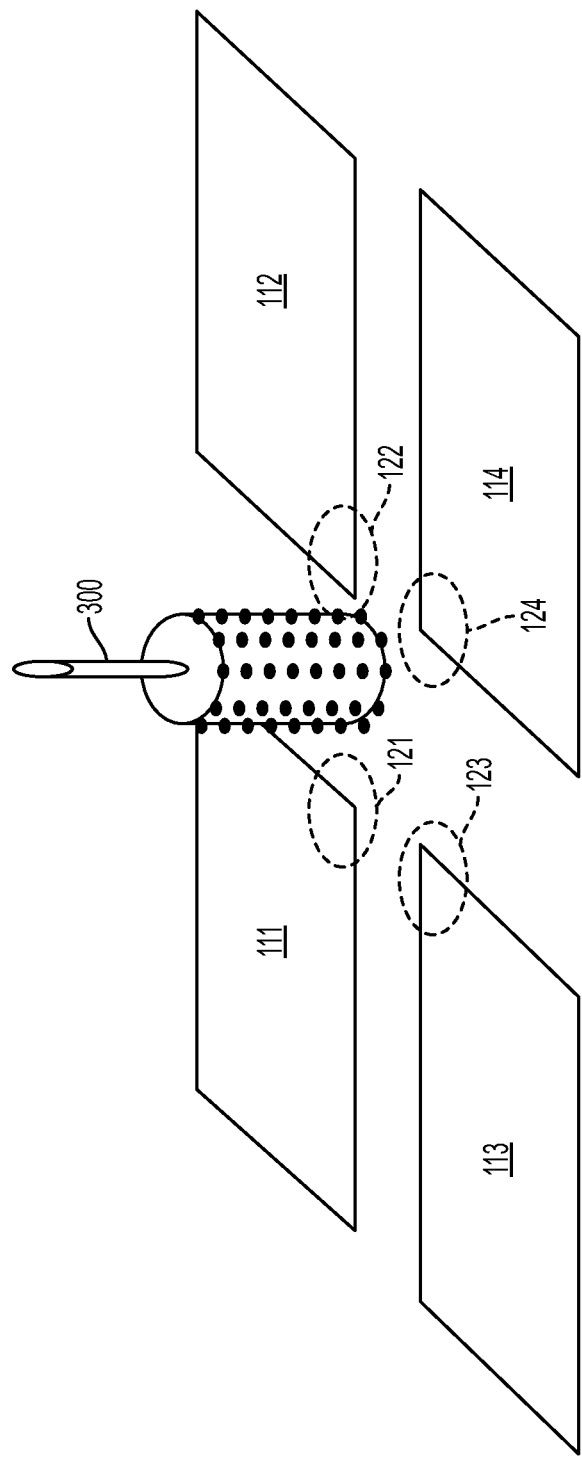
FIG. 5 is another close-up view of the wafer and the trimming device in accordance with one embodiment of the present disclosure.

FIG. 5 is another a close-up view of the wafer and the trimming device in accordance with one embodiment of the present disclosure. FIG. 5 provides a more detailed illustration with respect to how the trimming part 300 operates to alter the geometric shape of the semiconductor chip corners. In this embodiment, as FIG. 5 shows, the trimming part 300, when being applied to the semiconductor wafer 100, does not stay at a fixed position. Rather, the trimming part 300 moves laterally in a pre-programmed path to the targeted positions.

In this embodiment, the semiconductor wafer 100 is first aligned relative to the trimming device. Data corresponding to the arrangement and configuration of the semiconductor chips including the shape of the semiconductor chips and position may then be recognized or identified using a system for reading the surface of the semiconductor wafer 100 using, for example, a computer vision system or a scanning system. The trimming device having the trimming part 300 may then be activated and moved relative to the semiconductor wafer 100 based on the recognized data to trim the desired semiconductor material from the ninety-degree corners of the semiconductor chips.

In this embodiment, the trimming part 300 is first lowered on the semiconductor wafer 100 and positioned at the center of an intersection formed by a horizontal cutting groove and a vertical cutting groove. At this point, the trimming device is not in physical contact with the corners of any semiconductor chips 111, 112, 113, and 114.

Then, the trimming part 300 moves laterally in a pre-programmed circular path. Specifically, the trimming part 300 first moves away from its starting position towards the corner 121 of the semiconductor chip 111. At the same time, before the trimming part 300 reaches corner 121 of the semiconductor chip 111, the trimming part 300 begins to rotate along its longitudinal axis at a predetermined RPM. When the trimming part 300 reaches the corner 121 of the semiconductor chip 111, the side wall of the cylindrical trimming part 300, which is covered with a plurality of grinding grit, being in physical contact with the semiconductor chips' corners. As a result, the cylindrical trimming part 300 removes portions of semiconductor material from the corner 121 of the semiconductor chip 111 (i.e., trimming corner 121 of the semiconductor chip 111).

Next, after the trimming part 300 has removed the predetermined amount of material from the corner 121 of the semiconductor chip 111, the trimming part 300 moves laterally in a clock-wise direction toward corner 122 of the semiconductor chip 112. Again, the trimming part 300, while still rotating along its longitudinal axis, reaches the corner 122 of the semiconductor chip 112, removes portions of semiconductor material from the corner 122 of the semiconductor chip 112.

Thereafter, the trimming part 300 moves again laterally in a clock-wise direction, trimming corners 123 and 124 of the semiconductor chips 113 and 114, respectively. This constitutes one trimming cycle in accordance with the current disclosure.

Of course, the pre-programmed path of movement for the trimming part 300 does not have to be a circular shape. In fact, the movement path for the trimming part 300 can be programmed to form any path the user desires, based on the amount of the semiconductor material the user desires to remove from the corners of the semiconductor chips. For example, the trimming part 300 can start with trimming corner 121 of the semiconductor chip 111, and then move diagonally and trim corner 123 of the semiconductor chip 113 next.

Also, at the end, the semiconductor chips may have a variety of desired shapes including, for example a circular shape, a rounded edge shape, or any other contoured geometric shape. The movement path for the trimming part 300, therefore, can be modified to achieve the desired geometric shape for the semiconductor chips. In particular, after trimming by the trimming part 300, the four corners of the semiconductor chip are in an octagonal shape or a round shape. After the trimming step, the angle between one side of the semiconductor chip and the side that has been trimmed is greater than ninety degrees.

The embodiments discussed above solve the aforementioned problems associated with prior semiconductor chips. More specifically, the embodiments discussed above eliminate any corner with a ninety-degree angle in a semiconductor chip.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A cutting method of separating semiconductor chips, comprising:
    creating dicing channels on a semiconductor wafer, the dicing channels at least partially defining a geometrical shape of the semiconductor chips, the geometrical shape of the semiconductor chips having one or more corners;
    removing at least one corner of the one or more corners of the semiconductor chips with a drill by moving the drill laterally in a circular path, the circular path being in a plane parallel to a surface of the semiconductor wafer; and
    cutting along the dicing channels to separate the semiconductor chips after removing the at least one corner of the one or more corners.

2. The method of claim 1, wherein the semiconductor wafer is adhesively bonded to a backing sheet prior to the cutting along the dicing channels to separate the semiconductor chips.

3. The method of claim 2, wherein the backing sheet comprises a backing film and an adhesive layer.

4. The method of claim 3, wherein the backing film comprises a polymeric material.

5. The method of claim 3, wherein the adhesive layer is pressure sensitive adhesive.

6. The method of claim 1, wherein the drill comprises a rotating portion.

7. The method of claim 6, wherein the rotating portion comprises a cylindrically-shaped portion that acts as an abrasive drill.

8. The method of claim 7, wherein grit is dispersed on an outer surface of the cylindrical-shaped portion and the grit is used as an abrasive.

9. The method of claim 8, wherein the grit is formed of diamond.

10. The method of claim 8, wherein the grit is formed of cubic boron nitride.

11. The method of claim 8, wherein the size of the grit ranges from 2 to 8 um.

12. The method of claim 2, wherein the dicing channels comprise vertical and horizontal dicing channels thereby creating intersections.

13. The method of claim 6, wherein the dicing channels comprise vertical and horizontal dicing channels and wherein the drill is lowered onto a surface of the semiconductor wafer at an intersection created by the vertical and horizontal dicing channels.

14. The method of claim 9, wherein the drill is lowered onto a surface of the semiconductor wafer such that the drill touches the semiconductor wafer.

15. The method of claim 7, wherein the cylindrically-shaped portion rotates along its longitudinal axis at a predetermined rotational speed.

16. The method of claim 15, wherein the rotational speed of the cylindrically-shaped portion is adjustable.

17. The method of claim 6, wherein the drill travels laterally in a pre-programmed path.

18. The method of claim 1, wherein after the removing the corners of the one of the semiconductor chips, an angle between sides previously forming one of the corners of the semiconductor chip is greater than ninety degrees.

19. The method of claim 1, wherein after the removing the corners of the one of the semiconductor chips, the one of the semiconductor chips has a rounded shaped corner or octagonal shaped corner.

20. The method of claim 14, wherein the drill has a diameter configured to contact four corners of four semiconductor chips separated by intersecting dicing channels upon touching the semiconductor wafer.

* * * * *